United States Patent
Kim et al.

(10) Patent No.: US 7,214,620 B2
(45) Date of Patent: May 8, 2007

(54) METHODS OF FORMING SILICIDE FILMS WITH METAL FILMS IN SEMICONDUCTOR DEVICES AND CONTACTS INCLUDING THE SAME

(75) Inventors: Hyun-su Kim, Gyeonggi-do (KR); Gil-heyun Choi, Gyeonggi-do (KR); Jong-ho Yun, Gyeonggi-do (KR); Sug-woo Jung, Gyeonggi-do (KR); Eun-ji Jung, Gyeonggi-do (KR); Sang-bom Kang, Seoul (KR); Woong-hee Sohn, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 187 days.

(21) Appl. No.: 10/974,417

(22) Filed: Oct. 27, 2004

(65) Prior Publication Data

US 2005/0106859 A1     May 19, 2005

(30) Foreign Application Priority Data

Oct. 28, 2003   (KR)   ...................... 10-2003-0075327
Oct. 14, 2004   (KR)   ...................... 10-2004-0081986

(51) Int. Cl.
*H01L 21/44*        (2006.01)

(52) U.S. Cl. ...................... 438/682; 438/649; 438/655; 257/E21.593

(58) Field of Classification Search ................ 438/625, 438/626, 627, 637, 643–644, 649, 651, 655, 438/682, 683; 257/750, 754, 757, E21.593
See application file for complete search history.

(56) References Cited

U.S. PATENT DOCUMENTS

| | | | |
|---|---|---|---|
| 5,998,873 A | 12/1999 | Blair et al. | |
| 6,734,098 B2 | 5/2004 | Tseng et al. | |
| 2002/0093097 A1* | 7/2002 | Kamoshima et al. | 257/751 |
| 2004/0043601 A1* | 3/2004 | Park et al. | 438/629 |

FOREIGN PATENT DOCUMENTS

| | | |
|---|---|---|
| KR | 10-2000-0050300 | 8/2000 |
| KR | 10-2003-0023286 | 3/2003 |
| KR | 10-2004-0017038 A | 2/2004 |
| KR | 10-2004-0017655 A | 2/2004 |

OTHER PUBLICATIONS

Notice to Submit a Response for Korean Patent Application No. 10-2004-0081986 mailed on Feb. 24, 2006.

* cited by examiner

*Primary Examiner*—Kevin M. Picardat
(74) *Attorney, Agent, or Firm*—Myers Bigel Sibley & Sajovec, P.A.

(57) ABSTRACT

A method of forming a silicide film can include forming a first metal film on a silicon substrate and forming a second metal film on the first metal film at a temperature sufficient to react a first portion of the first metal film in contact with the silicon substrate to form a metal-silicide film. The second metal film and a second portion of the first metal film can be removed so that a thin metal-silicide film remains on the silicon substrate. Then, a metal wiring film can be formed on the thin metal-silicide film and the metal wiring film can be etched.

20 Claims, 9 Drawing Sheets

METHODS OF FORMING SILICIDE FILMS WITH METAL FILMS IN SEMICONDUCTOR DEVICES AND CONTACTS INCLUDING THE SAME

CROSS-REFERENCE TO RELATED APPLICATIONS

This application claims priority under 35 USC § 119 to a Korean Patent Application No. 2003-75327, filed on Oct. 28, 2003 and a Korean Patent Application No. 2004-81986, filed on Oct. 14, 2004 the contents of which are incorporated herein by reference in their entireties.

FIELD OF THE INVENTION

The present invention relates to methods of forming a silicide films in semiconductor devices.

BACKGROUND

As the integration of semiconductor devices becomes high, a design rule for the semiconductor device gradually decreases so that an opening or a contact hole for electrically connecting metal wirings, such as a bit line, also has a high aspect ratio. When the metal wiring including a metal barrier layer and a metal plug is formed in the opening or the contact hole, a metal layer can have good step coverage and low contact resistance to improve reliability and performance of the semiconductor device.

The contact resistance of the semiconductor device generally decreases when a resistance reduction layer is provided between the metal plug and a semiconductor substrate. The resistance reduction layer may be called as an ohmic layer. The ohmic layer can include metal silicide such as cobalt silicide.

It is known to form a cobalt silicide layer using two heat treatment processes to form metal wiring that includes the cobalt silicide layer. Particularly, after a cobalt layer is formed on a substrate, the cobalt layer is thermally treated by a primary heat treatment process to convert the cobalt layer into a cobalt silicide layer. Then, the cobalt silicide layer is thermally treated by a secondary heat treatment process because the cobalt silicide layer has high resistance. However, the above referenced conventional method for forming the cobalt silicide layer is somewhat complicated due to the two heat treatment processes although the cobalt silicide layer having relatively low resistance may be obtained.

A method of forming a cobalt silicide layer as an ohmic layer is discussed in Korean Patent Laid Open Publication No. 2004-17655, U.S. Pat. No. 5,998,873 issued to Blair et al., and U.S. Pat. No. 6,734,098 issued to Tseng et al. According to the above-mentioned Korean Patent Laid Open Publication, a simple method of forming a metal wiring with a cobalt silicide film can be performed without several heat treatment processes.

FIGS. 1A to 1C are cross sectional views illustrating the method of forming the metal wiring including the cobalt silicide film. Referring to FIG. 1A, after an insulation layer 3 including a contact hole 2 is formed on a substrate 1, a cobalt film 4 is formed on the insulation layer 3 and an inside of the contact hole 2 including on the sidewall of the contact hole 2.

Referring to FIG. 1B, a titanium film 5 is formed on the cobalt film 4 at a temperature of about 400 to about 750° C. by a chemical vapor deposition process. The titanium film 5 and the cobalt film 4 serve together as an ohmic layer. When the titanium film 5 is formed at the high temperature, a cobalt silicide film 6 is formed on a bottom face of the contact hole 2. After a titanium nitride film 7 is formed on the titanium film 5, a conductive layer 8 is formed on the titanium nitride film 7 to fill the contact hole 2. The conductive layer 8 is formed using tungsten, aluminum, etc.

Referring to FIG. 1C, the conductive layer 8 is partially etched to form a metal wiring 9 on the substrate 1. Here, the metal wiring 9 includes a plug that makes contact with the substrate 1 through the cobalt silicide film 6. As is shown in FIG. 1C, a portion of the cobalt film 4 remains under the metal wiring on the sidewall of the contact hole 2 and on the substrate outside the contact hole 2.

However, in the above-mentioned method of forming the metal wiring, the cobalt film 4 on the insulation layer 3 is not easily etched by a dry etching process so that the cobalt film 4 may remain beneath the metal wiring 9 on the sidewall of the contact hole 2 and on the substrate outside the contact hole 2 as discussed above. Alternatively, if the cobalt film 4 is wet etched, the metal wiring including 9 the plug may be damaged. In either case, leakage current may be generated (by the damaged metal wiring 9 or by the portion of the cobalt film 4 that remains beneath the metal wiring 9) despite the etching.

FIG. 2 is a graph illustrating leakage current distributions of metal wirings formed in accordance with a conventional method. In FIG. 2, I indicates a leakage current distribution of a metal wiring that includes a titanium film having a thickness of about 85 Å and a titanium nitride film having a thickness of about 250 Å, and II indicates a leakage current distribution of a metal wiring that further includes a cobalt silicide film having a thickness of about 50 Å besides the titanium film and the titanium nitride film. Here, the titanium, the titanium nitride and the cobalt silicide films are formed by a chemical vapor deposition process at a high temperature of about 400 to about 750° C. As shown in FIG. 2, the leakage current of II is larger than the leakage current of I because a portion of a cobalt film, which is formed beneath the metal wiring to form the cobalt silicide film, remains beneath the metal wiring although a wet etching process or a dry etching process is executed to remove the remaining portion of the cobalt film beneath the metal wiring. Therefore, electric characteristics of a semiconductor device including the cobalt silicide film may be deteriorated.

SUMMARY

Embodiments according to the invention can provide methods of forming silicide films with metal films in semiconductor devices and contacts including the same. Pursuant to these embodiments, methods of forming a silicide film can include forming a first metal film on a silicon substrate and forming a second metal film on the first metal film at a temperature sufficient to react a first portion of the first metal film in contact with the silicon substrate to form a metal-silicide film. The second metal film and a second portion of the first metal film can be removed so that a thin metal-silicide film remains on the silicon substrate. Then, a metal wiring film can be formed on the thin metal-silicide film and the metal wiring film can be etched.

In some embodiments according to the invention, removing the second metal film and a second portion of the first metal film further can include removing a portion of the metal-silicide film to form the thin metal-silicide film on the silicon substrate. In some embodiments according to the invention, the first metal film is formed in a recess in the substrate and the second metal film is formed on the first metal film in the recess. Removing second metal film and a second portion of the first metal film can include removing the second portion from a sidewall of the recess.

In some embodiments according to the invention, removing the second portion from a sidewall of the recess can include wet etching the second portion from the sidewall of the recess. In some embodiments according to the invention, the first metal film is formed in a recess in the substrate and the second metal film is formed on the first metal film in the recess, wherein the metal-silicide film is formed at a base of the recess.

In some embodiments according to the invention, forming a second metal film on the first metal film can include forming the second metal film at a temperature of about 400 degrees Centigrade to about 700 degrees Centigrade to form the metal-silicide film to a thickness of about 30 Angstroms to about 100 Angstroms. In some embodiments according to the invention, forming a second metal film on the first metal film can include forming the second metal film so that less than all of the first metal film at a base of a recess in the substrate is reacted with the silicon to form the metal-silicide film. In some embodiments according to the invention, the second portion of the first metal film is formed at the base of the recess.

In some embodiments according to the invention, the second portion of the first metal film is removed from the metal-silicide film at a base of the recess. In some embodiments according to the invention, the thin metal silicide film is free of impurities of carbon, oxygen, and hydrogen.

In some embodiments according to the invention, a method of forming a silicide film can include forming a recess in a silicon substrate and forming a first metal film in the recess including on a sidewall and at a base thereof. A second metal film is formed on the first metal film at a temperature sufficient to react a portion of the first metal film in contact with the silicon substrate at the base of the recess to form a metal-silicide film thereat and an unreacted portion of the first metal film along the sidewall. The second metal film, the unreacted portion of the first metal film, and a portion of the metal-silicide film at the base are wet etched so that a thin metal-silicide film remains on the silicon substrate at the base.

In some embodiments according to the invention, the method further includes forming a metal wiring film on the thin metal-silicide film in the recess and etching the metal wiring film on the substrate outside the recess. In some embodiments according to the invention, the thin metal silicide film is free of impurities of carbon, oxygen, and hydrogen.

In some embodiments according to the invention, a method of forming a silicide film can include removing a second metal film and a portion of an underlying first metal film used to form a thin metal-silicide film on a silicon substrate in a recess so that a reacted portion of the metal-silicide remains at a base of the recess, the second metal film having an increased amount of impurities introduced therein from the first metal film during formation of the second metal film.

In some embodiments according to the invention, a contact in a semiconductor device can include a recess in a silicon substrate including a sidewall and a base inside the recess opposite and opening of the recess. A thin metal-silicide film is at the base and is absent from a portion of the sidewall inside the recess above the base. A first metal film is on the thin metal-silicide film and is on the sidewall including the portion from which the metal-silicide film is absent. A second metal film is on the first metal film in the recess to a level about equal to the opening of the recess.

In some embodiments according to the invention, the thin metal-silicide film can have a thickness of about 30 Angstroms to about 100 Angstroms. In some embodiments according to the invention, the thin metal silicide film is free of impurities of carbon, oxygen, and hydrogen. In some embodiments according to the invention, the second metal film includes a planarized surface level with the substrate outside the opening of the recess and the contact further includes a third metal film on the planarized surface and on the substrate outside the opening of the recess. In some embodiments according to the invention, the first metal film can include cobalt and the second metal film can include titanium, titanium nitride, and/or a combination thereof.

Figure 1A:
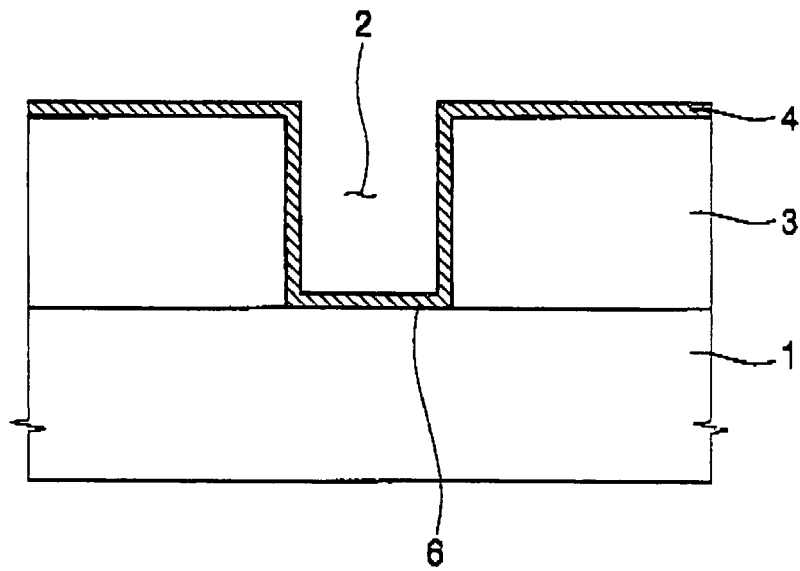
FIGS. 1A to 1C are cross sectional views illustrating a conventional method of forming metal wiring including a cobalt silicide film.
Figure 1B:
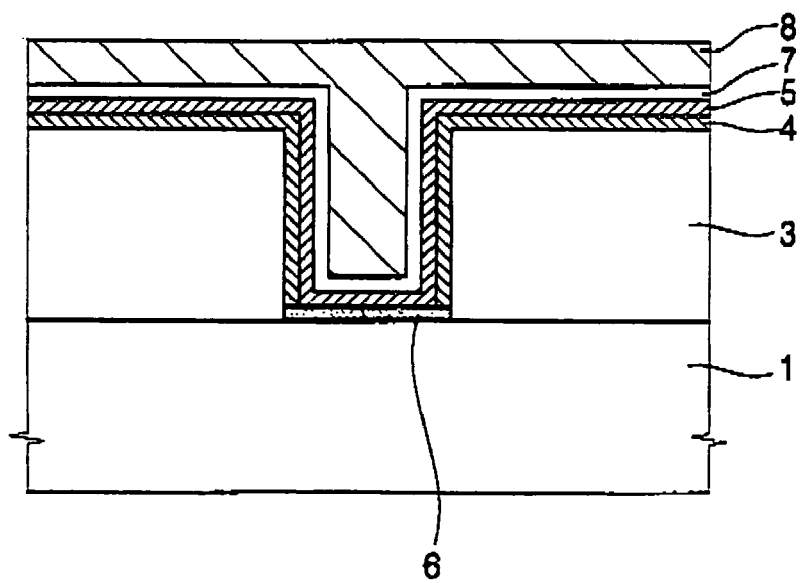
Figure 1C:
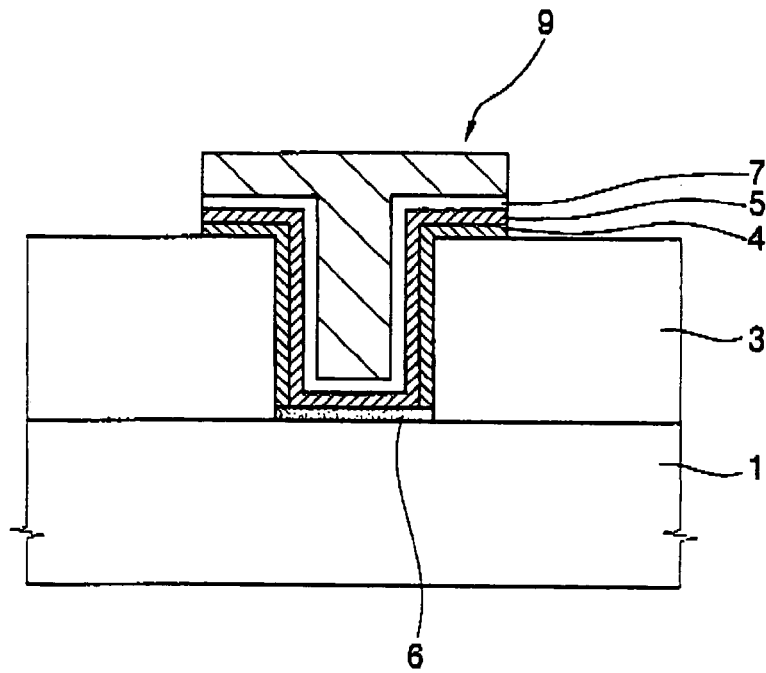
Figure 2:
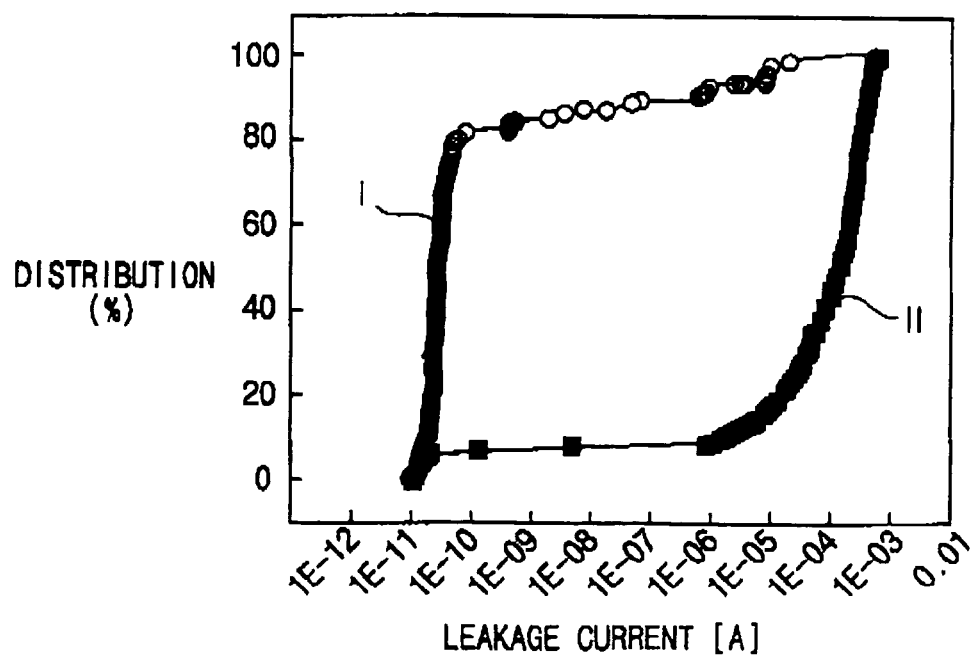
FIG. 2 is a graph illustrating leakage current distributions of metal wiring in accordance with a conventional method.

DESCRIPTION OF EMBODIMENTS
ACCORDING TO THE INVENTION

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, film, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, film, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. It will be understood that the terms "film" and "layer" mat be used interchangeably herein.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies). For example, in some embodiments according to the invention, an ohmic contact can be a contact with a specific contact resistivity of less than about $10\ e\ -03$ ohm-cm$^2$ and, in some embodiments less than about $10\ e\ -04$ ohm-cm$^2$. Thus, a contact that is rectifying or that has a high specific contact resistivity, for example, a specific contact resistivity of greater than about $10\ e\ -03$ ohm-cm$^2$, is not an ohmic contact as that term is used herein.

As discussed herein in greater detail, in some embodiments according the invention, a silicide film can be formed by forming a first metal film on a silicon substrate followed by the formation of a second metal film thereon. The second metal film is formed at a temperature that is sufficient to cause a reaction between the first metal film and the underlying silicon substrate to form a metal-silicide film thereon. The second metal film and a portion of the first metal film are removed so that a thin metal-silicide film remains on the silicon substrate. Then, a metal wiring film is formed on the thin metal-silicide film. The metal wiring film can then been etched to form a desired pattern on the substrate.

As described above, the second metal film and a portion of the first metal film are removed prior to the formation of the metal wiring on the thin metal-silicide film so that, for example, unreacted portions of the first metal film on a sidewall of a recess that would otherwise underlie the subsequently formed metal wiring film can be removed (i.e. before formation of the metal wiring film). Leaving the unreacted portions of the first metal film beneath the metal wiring film may otherwise cause an increase in the specific resistance of a contact that includes the thin metal-silicide film.

Also, forming the second metal film at a sufficient temperature to cause the reaction between the first metal film and the silicon substrate can promote the transfer of impurities (such as carbon, oxygen, and hydrogen) included in the first metal film to the second metal film during the formation of the metal-silicide film (i.e., during the heating). Subsequently, the second metal film (including the transferred impurities from the first metal film) can be removed when forming the thin metal-silicide film. For example, in some embodiments according to the invention, a recess as formed in a silicon substrate as shown, for example, in FIGS. 4A–4G. A first metal film is formed in the recess including on a sidewall and at the base of the recess. A second metal film is formed on the first metal film at a temperature that is sufficient to react a portion of the first metal film in contact with a silicon substrate at a base of the recess to form a metal-silicide film there at, such as 400–800 degrees Centigrade.

Furthermore, an unreacted portion of the first metal film remains along the sidewall of the recess. The second metal film (along with the unreacted portion of the first metal film on the sidewall and a portion of the metal-silicide film at the base of the recess) can be wet etched so as to leave a thin metal-silicide film remaining at the base of the recess on the silicon substrate). Accordingly, in some embodiments according to the invention, a contact can be formed in a semiconductor device so that a metal silicide film remains only at a base of the recess and otherwise unreacted portions of the metal film used to form the metal-silicide film are absent from a sidewall of the contact hole.

Figure 3A:
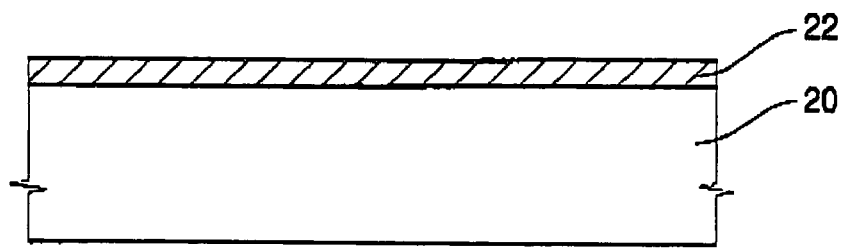
FIGS. 3A to 3C are cross-sectional views illustrating methods of forming a silicide layer in accordance with embodiments of the present invention.
Figure 3B:
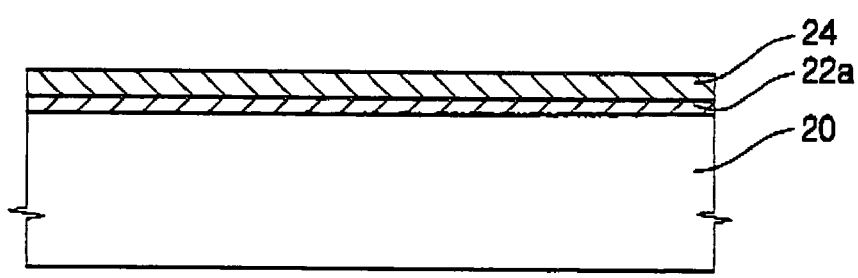
Figure 3C:
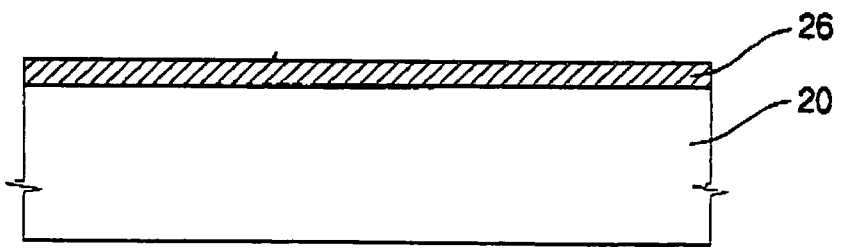

FIGS. 3A to 3C are cross-sectional views illustrating methods of forming a thin metal-silicide layer in accordance with some embodiments of the present invention. Referring to FIG. 3A, after a substrate 20 including silicon (Si) such as a silicon wafer is provided, a first metal film 22 is formed on the substrate 20. The first metal film 22 may be formed using metal such as cobalt (Co), molybdenum (Mo), nickel (Ni), tungsten (W), titanium (Ti), etc. The first metal film 22 may be preferably formed using cobalt. The first metal film 22 may have a thickness of about 10 to about 500 Å from an upper face of the substrate 20. For example, the first metal film 22 typically has a thickness of about 30 to about 100 Å. Additionally, the first metal film 22 may be formed by a chemical vapor deposition process, an atomic layer deposition process or a physical vapor deposition process, for example, a sputtering process or an evaporation process. In some embodiments of the present invention, the first metal film 22 having a thickness of about 30 Å is formed using cobalt by a chemical vapor deposition process so that step coverage of the first metal film 22 may be improved and manufacturing time and cost for the first metal film 22 may be reduced.

Referring to FIG. 3B, a second metal film 24 is formed on the first metal film 22. The second metal film 24 may be formed using titanium (Ti), titanium nitride (TiN) or a mixture of titanium and titanium nitride. The second metal film 24 may be formed by a chemical vapor deposition process, an atomic layer deposition process or a physical vapor deposition process. In some embodiments of the present invention, the second metal film 24 is a single layer structure that includes a titanium film, a titanium nitride film or a mixture film of titanium and titanium nitride. Alternatively, the second metal film 24 may have a multi layer structure in which at least one titanium film and at least one titanium nitride film are alternately formed on the first metal film 22. Here, the titanium film may have a thickness of about 5 to about 150 Å, preferably, a thickness of about 50 to about 100 Å and the titanium nitride film may have a thickness of about 50 to about 200 Å, preferably, a thickness of about 150 to about 200 Å. Thus, an entire thickness of the second metal film 24 may be in a range of about 55 to about 350 Å, preferably in a range of about 200 to about 300 Å. For example, the titanium film has a thickness of about 100 Å and the titanium nitride film has a thickness of about 200 Å so that the second metal film 24 has a thickness of about 300 Å.

The second metal film 24 is formed at a temperature of about 400 to about 800° C. As appreciated by the present inventors, if the second metal film 24 is formed at a temperature of below about 400° C., the first metal film 22 may not be converted into a metal silicide film 22a because metal in the first metal layer 22 does not react with silicon in the substrate 20. Thus, the second metal layer 24 is advantageously formed at a temperature of above about 400° C. As also appreciated by the present inventors, when the second metal film 24 is formed at a temperature of above about 800° C., the second metal film 24 may not be precisely formed on the first metal film 22. Accordingly, it may be difficult to control a thickness of the second metal film 24 formed on the first metal film 22 when a temperature for forming the second metal film 24 is too high. Therefore, the second metal film 24 may be formed at a temperature of below about 800° C., preferably a temperature of about 700° C. For example, the second metal film 24 is formed by a chemical vapor deposition process at a temperature of about 400 to about 700° C.

In some embodiments according to the present invention, when the second metal film 24 has the multi layer structure that includes the titanium films and the titanium nitride films, the second metal film 24 may be formed in-situ by the chemical vapor deposition process at the temperature of about 400 to about 700° C. In other embodiments according to the present invention, when the second metal film 24 is formed by the physical vapor deposition process such as a sputtering process or an evaporation process, the second metal film 24 may be formed at a temperature substantially different from that of the CVD process.

As discussed above, the second metal film 24 is formed at a temperature sufficient to cause the first metal film 22 to react with the silicon substrate with which it is in contact, so that a first portion of the first metal film 22 is converted into the metal silicide film 22a because metal in the first metal film 22 is reacted with silicon in the substrate 20. Here, the first portion of the first metal film 22 contacts a surface portion of the silicon substrate 20. For example, the first portion of the first metal film 22 corresponds to a lower portion of the first metal film 22. When the first metal film 22 includes cobalt, the metal silicide film 22a includes cobalt silicide in accordance with a silicidation reaction between cobalt in the first metal film 22 and silicon in the silicon substrate 20.

While the first metal film 22 is formed on the substrate 20, the first metal film 22 additionally includes impurities such as carbon (C), oxygen (O), hydrogen (H), etc. When the first portion of the first metal film 22 including the impurities is converted into the metal silicide film 22a to serve as a resistance reduction layer for a contact in a semiconductor device, contact resistance of the semiconductor device may increase due to the impurities in the metal silicide film 22a. According to the present invention, the impurities are transferred from the first metal film 22 (to the second metal film 24) while the second metal film 24 is formed on the first metal film 22. In particular, because bonding energy between the impurities and ingredients in the first metal film 22 is substantially lower than bonding energy between the impurities and ingredients in the second metal film 24, the impurities in the first metal film 22 are sufficiently gathered by the second metal film 24 while the second metal film 24 is formed on the first metal film 22, thereby reducing or removing the impurities from the first metal film 22. Thus, any additional process for removing the impurities in the first metal film 22 may not be needed.

As described above, the first metal film 22 is partially converted into the metal silicide film 22a in a process for forming the second metal film 24, and also the impurities in the first metal film 22 are captured by the second metal film 24 due to the bonding energy difference among the impurities, the first metal film 22 and the second metal film 24.

Referring to FIG. 3C, a second portion of the first metal film 22 and the second metal film 24 are removed from the substrate 20 to thereby form a thin layer 26 serving as the resistance reduction layer on the silicon substrate 20. The second portion of the first metal film 22 is not converted into the metal silicide film 22a because metal in the second portion of the first metal film 22 is not reacted with silicon in the substrate 20. That is, a silicidation reaction does not occur in the second portion of the first metal film 22. For example, the second portion of the first metal film 22 corresponds to an upper portion of the first metal film 22.

When the second portion of the first metal film 22 and the second metal film 24 are removed by a dry etching process, the second portion of the first metal film 22 may not be easily removed from the substrate 20. Hence, the second portion of the first metal film 22 and the second metal film 24 are advantageously removed by a wet etching process using an etching solution that includes sulfuric acid. In the present invention, the second metal film 24 may serve as a sacrificial layer that is completely removed from the thin layer 26 after converting the first portion of the first metal film 22 into the metal silicide film 22a and gathering the impurities in the first metal film 22.

When the second metal film 24 and the second portion of the first metal film 22 are removed, the thin layer 26 including the metal silicide film 22a is formed on the substrate 20. When a metal wiring including a contact is directly formed on a silicon substrate, contact resistance at an interface between the contact and the silicon substrate may increases. Hence, a metal silicide film is interposed between the contact and the silicon substrate to reduce contact resistance between the metal wiring and the silicon substrate. According to the present invention, because the thin layer 26 includes the metal silicide film 22a without impurities therein, the thin layer 26 may have greatly reduced specific resistance. Thus, when the semiconductor device includes the thin layer 26 between the substrate 20 and the contact as the resistance reduction layer, the semiconductor device may have sufficiently reduced contact resistance because the thin layer 26 has greatly reduced specific resistance. As a result, the thin layer 26 of the present embodiment may be advantageously employed for forming a metal wiring having the contact of the semiconductor device because the thin layer 26 does not include the unchanged portion of the first metal film 22 including cobalt.

Figure 4A:
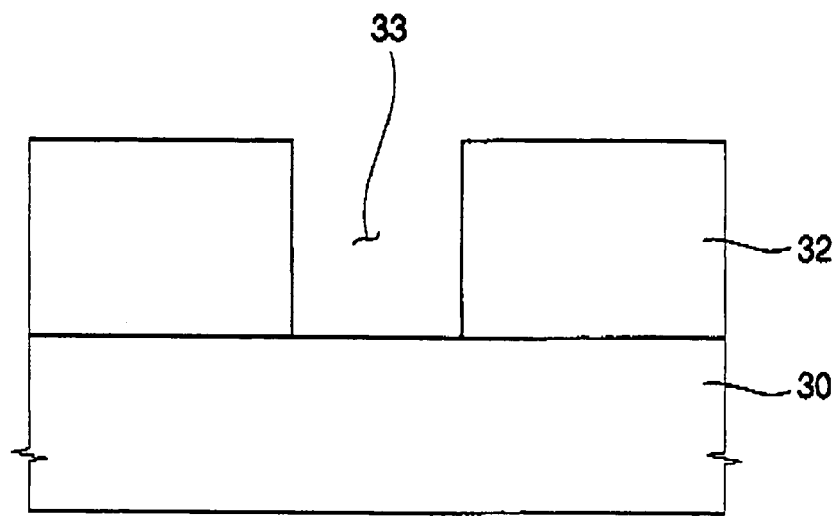
FIGS. 4A to 4G are cross-sectional views illustrating methods of manufacturing semiconductor devices in accordance with embodiments of the present invention and devices so formed.

FIGS. 4A to 4G are cross-sectional views illustrating methods of forming semiconductor devices in accordance with some embodiments of the present invention. Referring to FIG. 4A, a substrate 30 including silicon such as a silicon wafer is provided. The substrate 30 may include an isolation layer for defining an active region on the substrate 30. Additionally, the substrate 30 may include lower structures that have gate structures formed thereon and a source/drain region formed at a portion of the substrate 30 exposed between the gate structures. Here, the source/drain region is typically formed by implanting P or N type impurities with high concentration into the exposed portions of the substrate 30 and thermally treating the implanted impurities. Thus, $P^+$ or $N^+$ type source/drain region may be formed on the substrate 30.

An insulating interlayer 32 is formed on the substrate 30 to cover the lower structures. Examples of insulating material that may be used for the insulating interlayer 32 may include boro-phosphor silicate glass (BPSG), phosphor silicate glass (PSG), tetraethylorthosilicate (TEOS), spin on glass (SOG), undoped silicate glass (USG), high density plasma-chemical vapor deposition (HDP-CVD) oxide, etc. A contact hole or an opening 33 is formed through the insulating interlayer 32 to expose a portion of the substrate 30. For example, the source/drain region of the substrate 30 is partially exposed through the opening 33. The opening 33 may be formed by partially etching the insulating interlayer 32 by a photolithography process.

Figure 4B:
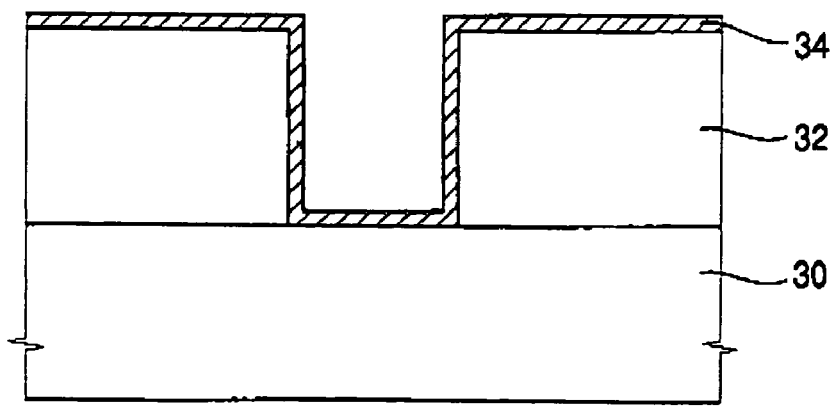

Referring to FIG. 4B, a first metal film 34 is formed on the insulating interlayer 32, an inside of the opening 33 and the exposed portion of the substrate 30. As described above, the first metal film 34 may be formed using metal such as cobalt, nickel, titanium, molybdenum or tungsten by a chemical vapor deposition process, an atomic layer deposition process or a physical vapor deposition process. The first metal film 34 has a thickness of about 10 to about 500 Å measured based on an upper face of the substrate 30. The first metal film 34 may be preferably formed using cobalt by the chemical vapor deposition process. Particularly, the first metal film 34 is formed using cobalt by the chemical vapor deposition process to have a thickness of about 30 to about 100 Å from the upper face of the substrate 30. When the first metal film 34 is formed by the chemical vapor deposition process, the first metal film 34 may have good step coverage so that the first metal film 34 is uniformly formed on the insulating interlayer 32, an inner sidewall of the opening 33 and the exposed portion of the substrate 30.

Figure 4C:
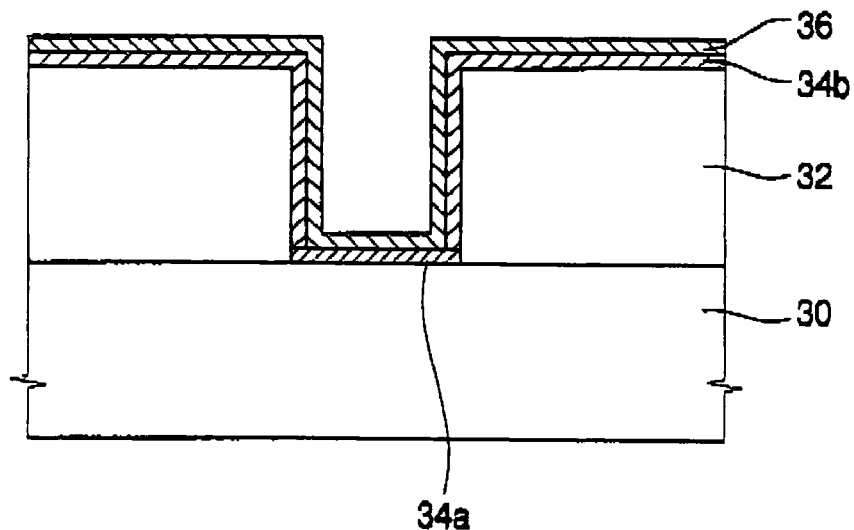

Referring to FIG. 4C, a second metal film 36 is formed on the first metal film 34. The second metal film 36 may be formed using titanium, titanium nitride or a mixture of titanium and titanium nitride. Here, the second metal film 36 includes a titanium film or a titanium nitride film. Alternatively, the second metal film 36 includes at least one titanium film and at least one titanium nitride film, which are alternately formed on the first metal film 34. The second metal film 36 may be formed at a temperature of about 400 to about 800° C. by a chemical vapor deposition process, an atomic layer deposition process or a physical vapor deposition process, thereby having a thickness of about 5 to about 150 Å from an upper face of the first metal film 34. For example, the second metal film 36 is formed at a temperature of about 400 to about 600° C. by the chemical vapor deposition process so that the second metal film 36 has a thickness of about 100 Å based on the upper face of the first metal film 34.

While the second metal film 36 is formed on the first metal film 34, a first portion of the first metal film 34, making contact with the substrate 30, is converted into a metal silicide film 34a in accordance with a silicidation reaction between metal in the first metal film 34 and silicon in the substrate 30. When the first metal film 34 includes cobalt, the metal silicide film 34a including cobalt silicide is formed on the exposed portion of the substrate 30. In addition, while the second metal film 36 is formed on the first metal film 34, impurities, for example carbon, oxygen or hydrogen, included in the first metal film 34 are gathered by the second metal film 36 because bonding energy between the impurities and the second metal film 36 is substantially higher than bonding energy between the impurities and the first metal film 34. While the first portion of the first metal film 34 is converted into the metal silicide film 34a, a second portion of the first metal film 34b is not converted into a metal silicide film because the silicidation reaction is not generated in the second portion of the first metal film 34b.

Figure 4D:
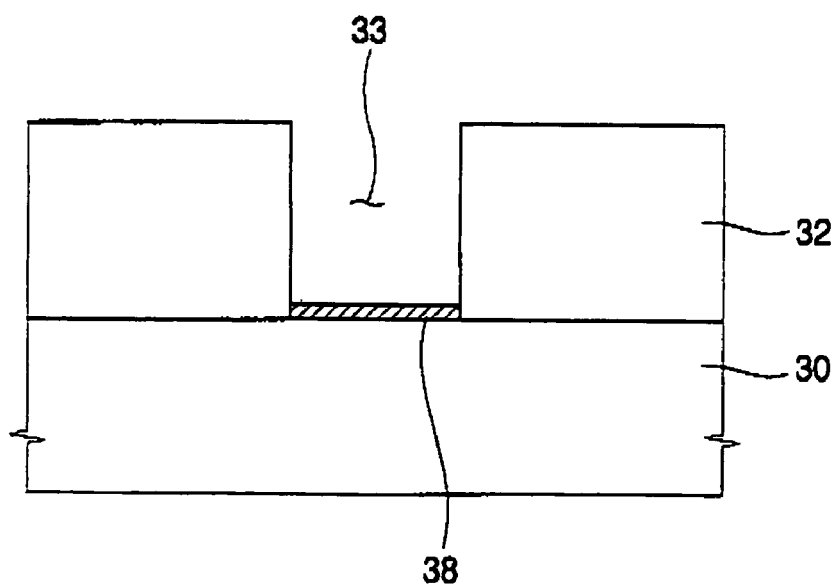

Referring to FIG. 4D, the second metal film 36 and the second portion of the first metal film 34b are removed from the insulating interlayer 32. The second metal film 36 and the second portion of the first metal film 34b may be removed by a wet etching process using an etching solution that contains sulfuric acid. In the present embodiment, the second metal film 36 serves as a sacrificial layer that is completely removed from a thin layer 38 after aiding a formation of the thin layer 38 on the exposed portion of the substrate 30.

When the second metal film 36 and the second portion of the first metal film 34b are removed, the insulating interlayer 32 and the inner sidewall of the opening 33 are exposed. As shown in FIG. 4D, the thin layer 38 including the metal silicide film 34a remains on the portion of the substrate 30 exposed through the opening 33. Since the impurities are removed from the thin layer 38 serving as a resistance reduction layer between a contact and a contact region of the substrate 30, the thin layer 38 may have a reduced specific resistance. Thus, a semiconductor device including the thin layer 38 as the resistance reduction layer may have reduced contact resistance, thereby improving electrical characteristics and reliability thereof.

Figure 4E:
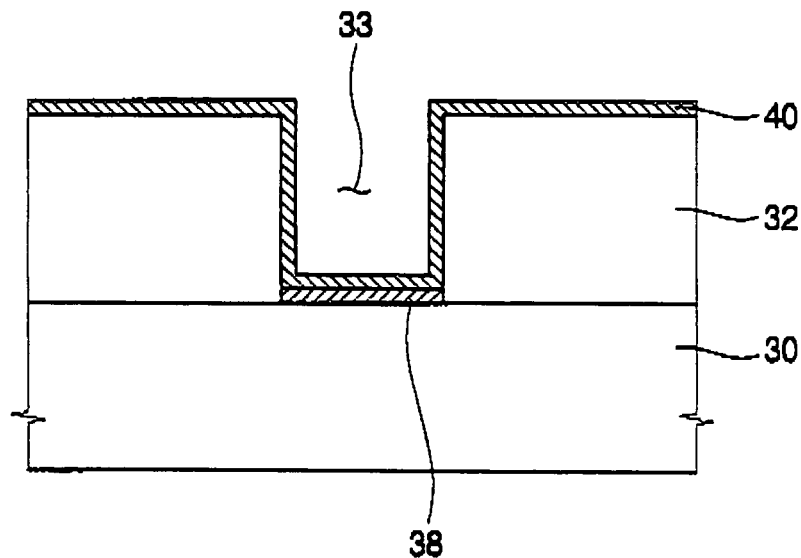

Referring to FIG. 4E, a third metal film 40 is formed on the insulating interlayer 32, the thin layer 38 and the inner sidewall of the opening 33. The third metal film 40 serves as a barrier layer and may be formed using titanium, titanium nitride, tantalum nitride, tungsten nitride or combinations thereof. The third metal film 40 may have a single layer structure including a titanium film, a titanium nitride film, a tantalum nitride film or a tungsten nitride film. Alternatively, the third metal film 40 may have a multi layer structure that includes at least two of a titanium film, a titanium nitride film, a tantalum nitride film and a tungsten nitride film. The third metal film 40 may be formed by a chemical vapor deposition process, an atomic layer deposition process or a physical vapor deposition process. For example, the third metal film 40 is advantageously formed by the chemical vapor deposition process so that the third metal film 40 has good step coverage. In some embodiments according to the present invention, the third metal film 40 has a double layer structure including a titanium film and a titanium nitride film. Here, the titanium film may have a thickness of about 5 to about 100 Å, preferably a thickness of about 50 to about 100 Å. Also, the titanium nitride film may have a thickness of about 50 to about 200 Å, preferably a thickness of about 150 to about 200 Å. Hence, the third metal film 40 including the titanium and titanium nitride films may have a thickness of about 55 to about 350 Å, preferably a thickness of about 200 to about 300 Å.

Figure 4F:
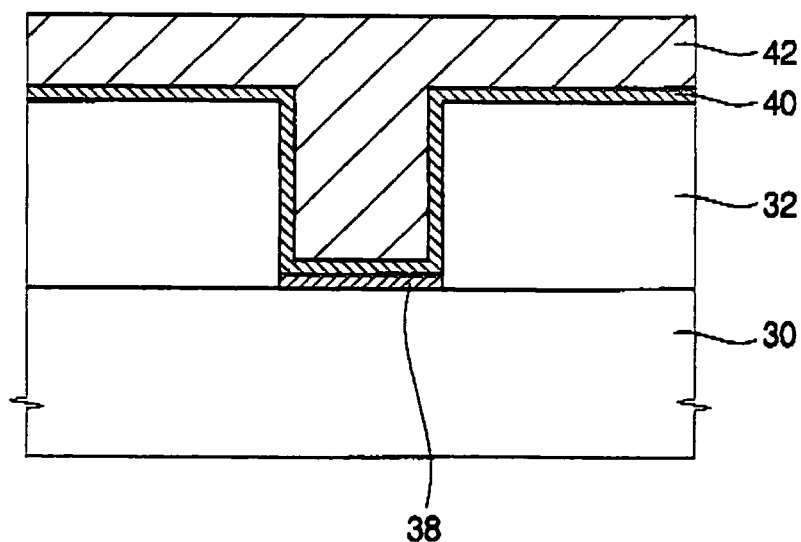

Referring to FIG. 4F, a fourth metal film 42 is formed on the third metal film 40 to fill the opening 33. The fourth metal film 42 includes material substantially identical to that of the third metal film 40. Alternatively, the fourth metal film 42 includes material different from that of the third metal film 40. Particularly, the fourth metal film 42 may be formed using tungsten, aluminum, titanium nitride, tantalum nitride or a mixture thereof by a chemical vapor deposition process, an atomic layer deposition process or a physical vapor deposition process. As described above, the fourth metal film 42 may have a single layer structure including a titanium film, a titanium nitride film, a tantalum nitride film or a tungsten nitride film. Alternatively, the fourth metal film 42 may have a multi layer structure that includes at least two of a titanium film, a titanium nitride film, a tantalum nitride film and a tungsten nitride film. In some embodiments according to the present invention, the fourth metal film 42 may be planarized by a chemical mechanical polishing process.

Figure 4G:
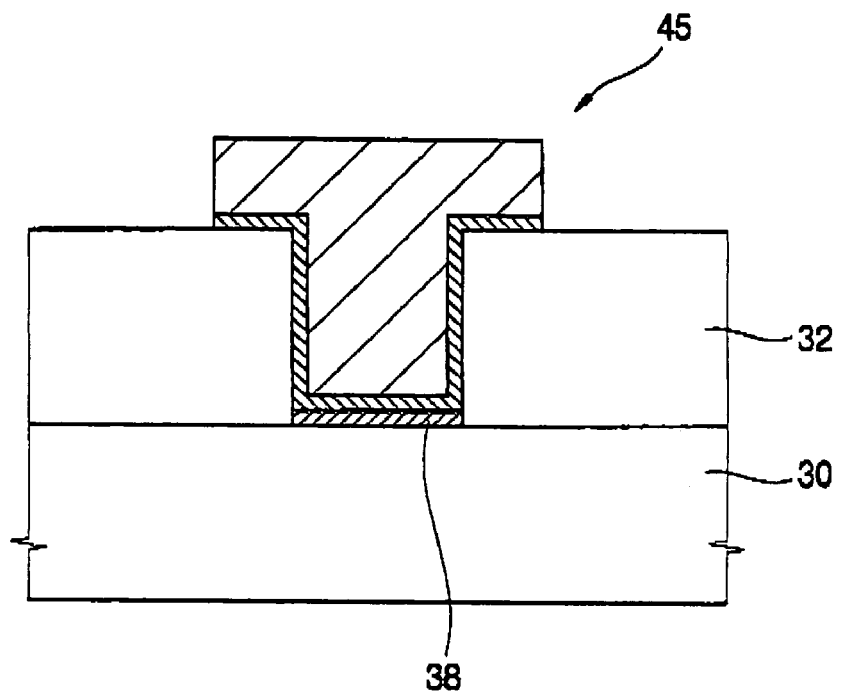

Referring to FIG. 4G, a metal wiring 45 filling the opening 33 is formed on the insulating interlayer 32 and the thin layer 38 by patterning the fourth metal film 42 and the third metal film 40. Here, the thin layer 38 is interposed between the metal wiring 45 and the exposed portion of the substrate 30 as the resistance reduction layer for decreasing contact resistance of the metal wiring 45. When the metal wiring 45 is formed by a wet etching process, underlying structure including the thin layer 38 may be damaged in the wet etching process. Thus, the fourth and third metal films 42 and 40 are etched by a dry etching process to form the metal wiring 45 on the substrate 30. Additionally, when the metal wiring 45 is formed by the dry etching process, etched residues causing leakage current from the metal wiring 45 may not remain on the metal wiring 45 or the insulating interlayer 32. Therefore, the semiconductor device of the present embodiment includes the thin layer 38 having low specific resistance and the metal wiring 45 without leakage current because the thin layer 38 does not include the unchanged portion of the first metal film 34 including cobalt.

Figure 5A:
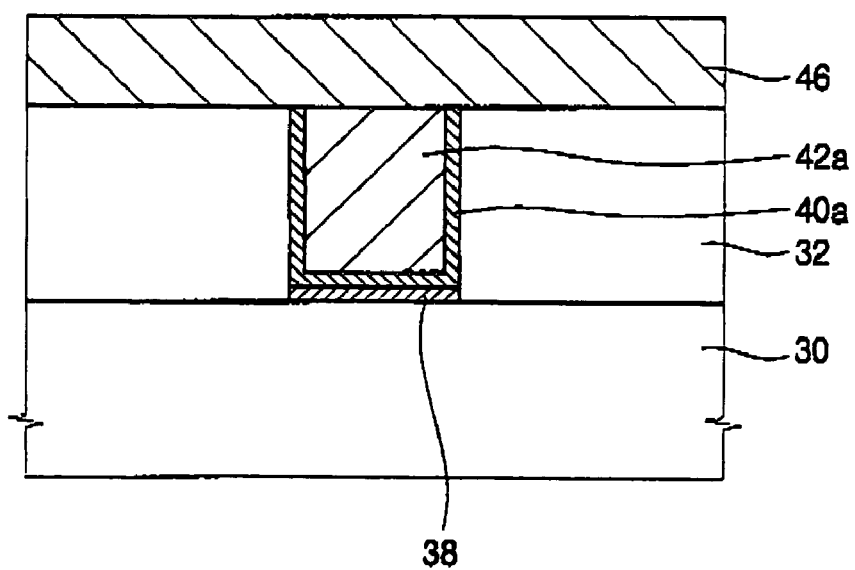
FIGS. 5A and 5B are cross-sectional views illustrating methods of manufacturing a semiconductor device in accordance with embodiments of the present invention.
Figure 5B:
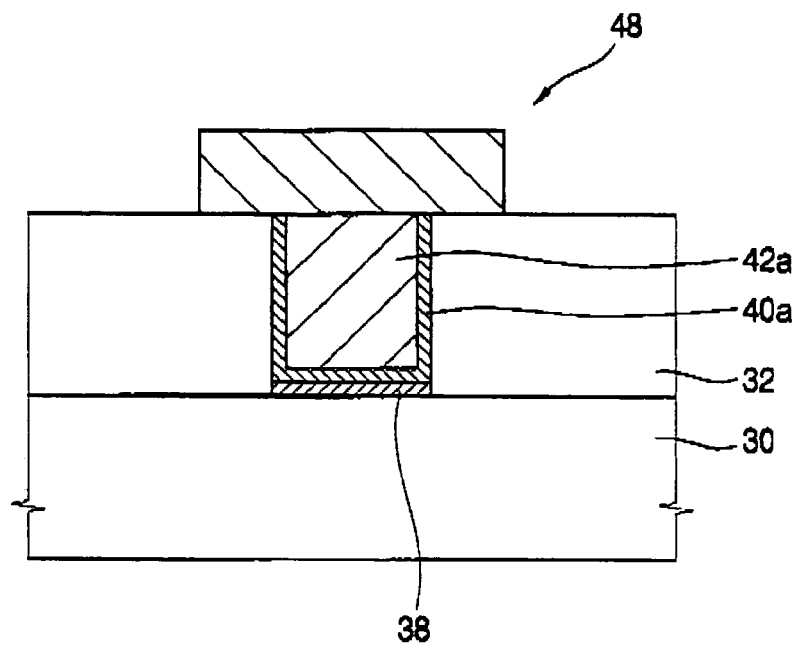

FIGS. 5A and 5B are cross-sectional views illustrating a method of manufacturing a semiconductor device in accordance with some embodiments of the present invention. In some embodiments according to the invention, a process for forming a fourth metal film is substantially identical to a process described with reference to FIG. 3A to 3F.

Referring to FIG. 5A, the fourth metal film and a third metal film are partially removed until an insulating interlayer 32 is exposed by a chemical mechanical polishing process, thereby forming a metal plug or a metal contact in an opening or a contact hole formed through the insulating interlayer 32. Alternatively, the fourth metal film and the third metal film may be partially removed by an etch back process or a combination process of a chemical mechanical polishing and an etch back.

The metal plug includes a third metal film pattern 40a and a fourth metal film pattern 42a. The third metal film pattern 40a is positioned on an inner sidewall of the opening and a thin layer 38 including a metal silicide film as described above. The fourth metal film pattern 42a is formed on the third metal film pattern 40a to fill the opening.

A fifth metal film 46 is formed on the insulating interlayer 32 and the metal plug. The fifth metal film 46 includes material substantially identical to that of the fourth metal film and/or that of the third metal film. Alternatively, the fifth metal film 46 includes material different from that of the fourth metal film and/or that of the third metal film. In particular, the fifth metal film 46 may be formed using tungsten, aluminum, titanium nitride, tantalum nitride or a mixture thereof by a chemical vapor deposition process, an atomic layer deposition process or a physical vapor deposition process. The fifth metal film 46 may have a single layer structure including a titanium film, a titanium nitride film, a tantalum nitride film or a tungsten nitride film. Alternatively, the fifth metal film 46 may have a multi layer structure that includes at least two of a titanium film, a titanium nitride film, a tantalum nitride film and a tungsten nitride film. In some embodiments according to the present invention, the fifth metal film 46 may be planarized by a chemical mechanical polishing process.

Referring to FIG. 5B, the fifth metal film 46 is partially etched to form a metal wiring 48 on the insulating interlayer 32 and the metal plug. The metal wiring 48 is electrically connected to a contact region of a substrate 30 through the metal plug and the thin layer 38 that serves as a resistance reduction layer for decreasing a contact resistance between the metal plug and the contact region of the substrate 30. The contact region of the substrate 30 may correspond to a source/drain region.

The metal wiring 48 may be formed by a dry etching process because underlying structure including the metal plug may be damaged when the fifth metal film 46 is partially etched by a wet etching process. In addition, etched residues causing leakage current may not remain on the metal wiring 48 or the insulating interlayer 32 when the metal wiring 48 is formed by the dry etching process. Thus, a semiconductor device of the present embodiment includes the thin layer 38 having low specific resistance and the metal wiring 48 without leakage current.

Figure 6:
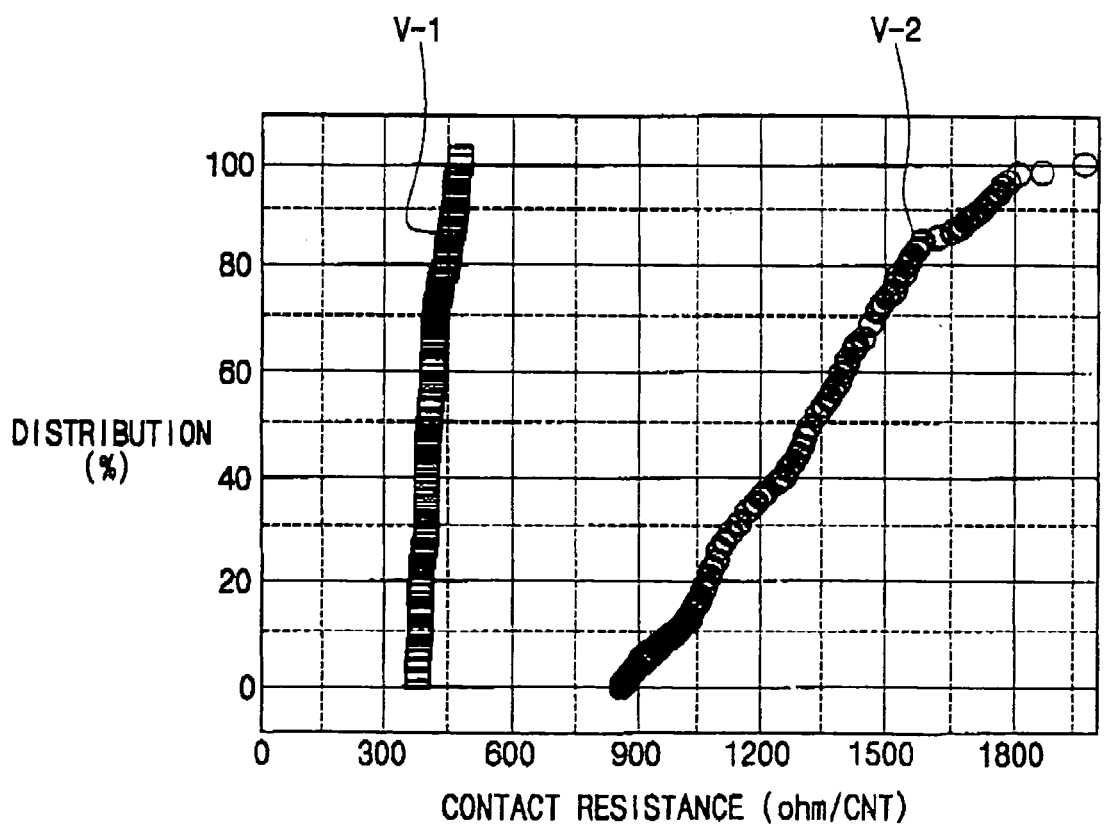
FIG. 6 is a graph illustrating contact resistance distributions of metal wirings contacting $N^+$ type contact regions in accordance embodiments of the present invention.

FIG. 6 is a graph illustrating contact resistance distributions of metal wiring making contact with N$^+$ type contact regions in accordance with some embodiments of the present invention. The N$^+$ type contact region may correspond to a source/drain region formed on a semiconductor substrate.

In FIG. 6, V-1 indicates contact resistance distribution of a first metal wiring including a thin layer as a resistance reduction layer in accordance with the processes described with reference to FIGS. 4A to 4G and V-2 represents contact resistance distribution of a second metal wiring without a thin layer as a resistance reduction layer. Particularly, the first metal wiring includes the thin layer having a thickness of about 50 Å, a metal barrier layer having a thickness of about 100 Å and a titanium nitride layer having a thickness of about 200 Å. The second metal wiring includes a metal barrier layer having a thickness of about 100 Å and a titanium nitride layer having a thickness of about 200 Å. Each of the first and second metal wirings contacts the N$^+$ type contact region formed on a substrate. As shown in FIG. 6, the contact resistance of V-1 is lower than that of V-2 because the thin layer may sufficiently reduce contact resistance between the N$^+$ type contact region and the first metal wiring.

Figure 7:
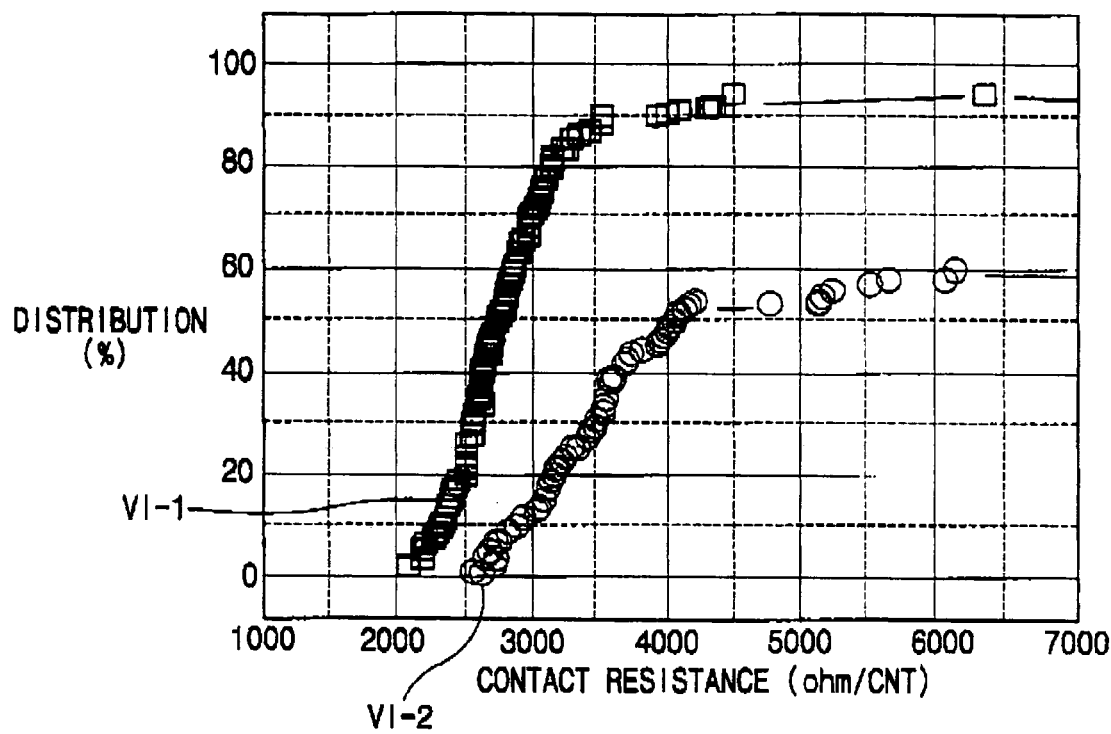
FIG. 7 is a graph illustrating contact resistance distributions of metal wiring contacting $P^+$ type contact regions in accordance embodiments of the present invention.

FIG. 7 is a graph illustrating contact resistance distributions of metal wiring contacting P$^+$ type contact regions in accordance with some embodiments of the present invention. The P$^+$ type contact region may correspond a source/drain region formed on a semiconductor substrate. In FIG. 7, VI-1 indicates contact resistance distribution of a first metal wiring including a thin layer as a resistance reduction layer in accordance with the processes described with reference to FIGS. 4A to 4G, and VI-2 represents contact resistance distribution of a second metal wiring without a thin layer as a resistance reduction layer. In particular, the first metal wiring includes the thin layer having a thickness of about 50 Å, a metal barrier layer having a thickness of about 100 Å and a titanium nitride layer having a thickness of about 200 Å. The second metal wiring includes a metal barrier layer having a thickness of about 100 Å and a titanium nitride layer having a thickness of about 200 Å. Each of the first and second metal wirings contacts the P$^+$ type contact region formed on a substrate.

Referring to FIG. 7, the contact resistance of VI-1 is lower than that of VI-2 because the thin layer may sufficiently reduce contact resistance between the P$^+$ type contact region and the first metal wiring.

Figure 8:
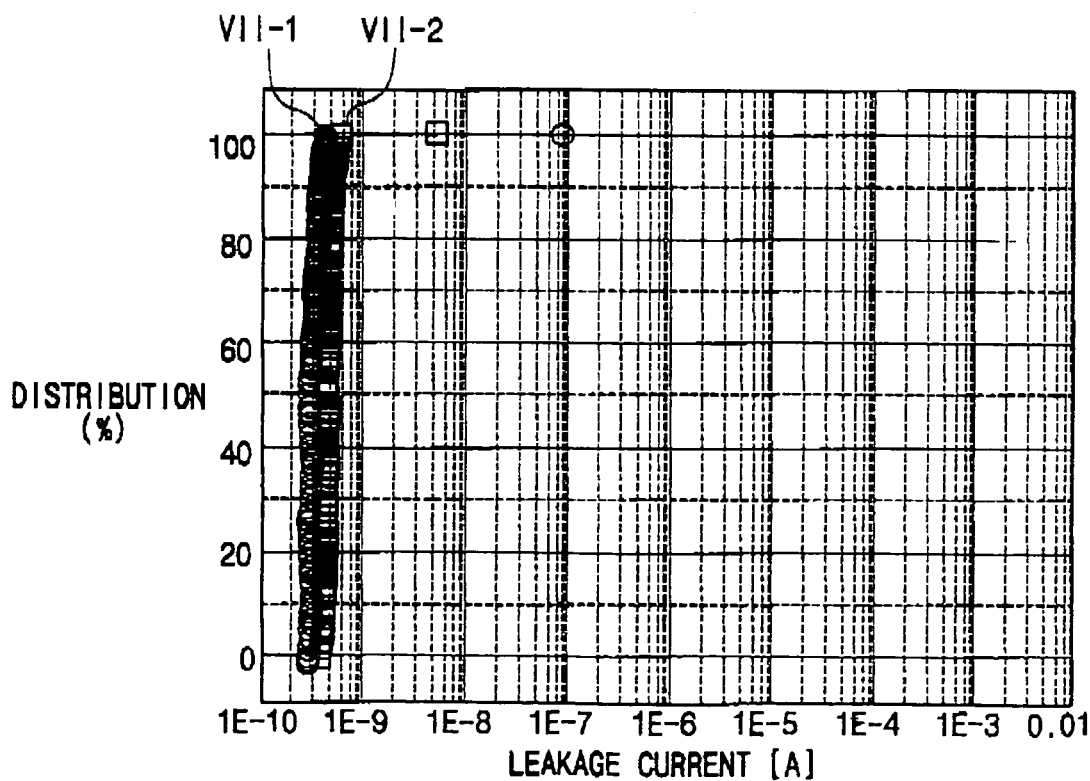
FIG. 8 is a graph illustrating leakage current distributions of metal wiring in accordance with embodiments of the present invention.

FIG. 8 is a graph illustrating leakage current distributions of metal wiring in accordance with some embodiments of the present invention. In FIG. 8, VII-1 indicates leakage current distribution of a first metal wiring including a thin layer as a resistance reduction layer in accordance with the processes described with reference to FIGS. 3A to 3G, and VII-2 represents leakage current distribution of a second metal wiring without a thin layer as a resistance reduction layer. In particular, the first metal wiring includes the thin layer having a thickness of about 50 Å, a metal barrier layer having a thickness of about 100 Å and a titanium nitride layer having a thickness of about 200 Å. The second metal wiring includes a metal barrier layer having a thickness of about 100 Å and a titanium nitride layer having a thickness of about 200 Å.

Referring to FIG. 8, the leakage current generated from the first metal wiring indicated as VI-1 is substantially similar to the leakage current from the second metal wiring indicated as VI-2 because the thin layer may have no effect on the leakage current generated from a metal wiring.

According to the present invention, an additional metal film is provided as a sacrificial layer in a process for forming a thin layer that serves as a resistance reduction layer between a metal wiring and a contact region of a substrate in a semiconductor device. Therefore, the semiconductor device may have sufficiently low contact resistance without generation of leakage current to improve electrical characteristics and reliability thereof. Additionally, the thin layer including a metal silicide film may be formed with reduced (or no) impurities therein by employing the additional metal as the sacrificial layer.

Furthermore, in some embodiments according the invention, a silicide film can be formed by forming a first metal film on a silicon substrate followed by the formation of a second metal film thereon. The second metal film is formed at a temperature that is sufficient to cause a reaction between the first metal film and the underlying silicon substrate to form a metal-silicide film thereon. The second metal film and a portion of the first metal film are removed so that a thin metal-silicide film remains on the silicon substrate. Then, a metal wiring film is formed on the thin metal-silicide film. The metal wiring film can then been etched to form a desired pattern on the substrate.

As described above, the second metal film and a portion of the first metal film are removed prior to the formation of the metal wiring on the thin metal-silicide film so that, for example, unreacted portions of the first metal film on a sidewall of a recess that would otherwise underlie the subsequently formed metal wiring film can be removed (i.e. before formation of the metal wiring film). Leaving the unreacted portions of the first metal film beneath the metal wiring film may otherwise cause an increase in the specific resistance of a contact that includes the thin metal-silicide film.

Also, forming the second metal film at a sufficient temperature to cause the reaction between the first metal film and the silicon substrate can promote the transfer of impurities (such as carbon, oxygen, and hydrogen) included in the first metal film to the second metal film during the formation of the metal-silicide film (i.e., during the heating). Subsequently, the second metal film (including the transferred impurities from the first metal film) can be removed when forming the thin metal-silicide film. For example, in some embodiments according to the invention, a recess as formed in a silicon substrate. A first metal film is formed in the recess including on a sidewall and at the base of the recess. A second metal film is formed on the first metal film at a temperature that is sufficient to react a portion of the first metal film in contact with a silicon substrate at a base of the recess to form a metal-silicide film there at, such as 400–800 degrees Centigrade.

Furthermore, an unreacted portion of the first metal film remains along the sidewall of the recess. The second metal film (along with the unreacted portion of the first metal film on the sidewall and a portion of the metal-silicide film at the base of the recess) can be wet etched so as to leave a thin metal-silicide film remaining at the base of the recess on the silicon substrate). Accordingly, in some embodiments according to the invention, a contact can be formed in a semiconductor device so that a metal silicide film remains only at a base of the recess and otherwise unreacted portions of the metal film used to form the metal-silicide film are absent from a sidewall of the contact hole.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A method of forming a silicide film, comprising:
forming a first metal film on a silicon substrate;
forming a second metal film on the first metal film at a temperature sufficient to react a first portion of the first metal film in contact with the silicon substrate to form a metal-silicide film;
removing the second metal film and a second portion of the first metal film so that a thin metal-silicide film remains on the silicon substrate;
forming a metal wiring film on the thin metal-silicide film; and
etching the metal wiring film.

2. A method according to claim 1 wherein removing the second metal film and the second portion of the first metal film further comprises:
removing a portion of the metal-silicide film to form the thin metal-silicide film on the silicon substrate.

3. A method according to claim 1 wherein the first metal film is formed in a recess in the substrate and the second metal film is formed on the first metal film in the recess, wherein:
removing the second metal film and the second portion of the first metal film comprises removing the second portion from a sidewall of the recess.

4. A method according to claim 3 wherein removing the second portion from the sidewall of the recess comprises wet etching the second portion from the sidewall of the recess.

5. A method according to claim 2 wherein the first metal film is formed in a recess in the substrate and the second metal film is formed on the first metal film in the recess, wherein the metal-suicide film is formed at a base of the recess.

6. A method according to claim 1 wherein forming a second metal film on the first metal film comprises forming the second metal film at a temperature of about 400 degrees Centigrade to about 700 degrees Centigrade to form the metal-silicide film to a thickness of about 30 Angstroms to about 100 Angstroms.

7. A method according to claim 1 wherein forming a second metal film on the first metal film comprises forming the second metal film so that less than all of the first metal film at a base of a recess in the substrate is reacted with silicon included in the substrate to form the metal-silicide film.

8. A method according to claim 7 wherein the second portion of the first metal film is formed at the base of the recess.

9. A method according to claim 8 wherein the second portion of the first metal film is removed from the metal-silicide film at the base of the recess.

10. A method according to claim 1 wherein the thin metal silicide film is free of impurities of carbon, oxygen, and hydrogen.

11. A method of forming a suicide film, comprising:
forming a recess in a silicon substrate;
forming a first metal film in the recess, wherein the first metal film is formed on a sidewall and at a base of the recess;
forming a second metal film on the first metal film at a temperature sufficient to react a portion of the first metal film in contact with the silicon substrate at the base of the recess to form a metal-silicide film thereat and an unreacted portion of the first metal film along the sidewall; and
wet etching the second metal film, the unreacted portion of the first metal film, and a portion of the metal-silicide film at the base so that a thin metal-silicide film remains on the silicon substrate at the base.

12. A method according to claim 11 further comprising:
forming a metal wiring film on the thin metal-silicide film in the recess; and
etching the metal wiring film on the substrate outside the recess.

13. A method according to claim 11 wherein the thin metal silicide film is free of impurities of carbon, oxygen, and hydrogen.

14. A method according to claim 11 wherein forming a second metal film on the first metal film comprises forming the second metal film at a temperature of about 400 degrees Centigrade to about 700 degrees Centigrade to form the metal-silicide film to a thickness of about 30 Angstroms to about 100 Angstroms.

15. A method according to claim 11 wherein wet etching further comprises wet etching to sufficiently remove the unreacted portion of the first metal film from the sidewall.

16. A method of forming a silicide film, comprising:
removing a second metal film and a portion of an underlying first metal film used to form a thin metal-silicide film on a silicon substrate in a recess so that a reacted portion of the metal-silicide remains at a base of the recess, the second metal film having an increased amount of impurities introduced therein from the first metal film during formation of the second metal film.

17. A method of forming a silicide film, comprising:
forming a first metal ring on a silicon substrate;
forming a second metal film on the first metal film at a temperature sufficient to react a first portion of the first metal film in contact with the silicon substrate to form a metal-silicide film, wherein the second metal film gathers impurities from the first metal film;
removing the second metal film and a second portion of the first metal film so that a thin metal-silicide film, remains on the silicon substrate;
forming a metal wiring film on the thin metal-silicide film; and etching the metal wiring film.

18. A new method according to claim 17 wherein the impurities include carbon, oxygen, and/or hydrogen.

19. A method of forming a silicide film, comprising:
forming a recess in a silicon substrate;
forming a first metal in the recess, wherein the first metal film is formed on a sidewall and at a base of the recess;
forming a second metal film on the first metal film at a temperature sufficient to react a portion of the first metal film in contact with the silicon substrate at the base of the recess to form a metal-silicide film there at and an unreacted portion of the first metal film along the sidewall, wherein the second metal film gathers impurities from the first metal film; and wet etching the second metal film, the unreacted portion of the first metal film, and a portion of the metal-silicide film at the base so that a thin metal-silicide film remains on the silicon substrate at the base.

20. A method according to claim 19 wherein the impurities include carbon, oxygen, and/or hydrogen.

* * * * *

UNITED STATES PATENT AND TRADEMARK OFFICE
CERTIFICATE OF CORRECTION

PATENT NO. : 7,214,620 B2 Page 1 of 1
APPLICATION NO. : 10/974417
DATED : May 8, 2007
INVENTOR(S) : Kim et al.

It is certified that error appears in the above-identified patent and that said Letters Patent is hereby corrected as shown below:

In the Claims:

Column 15, Claim 5 Line 51: Please correct "metal-suicide"
To read -- metal-silicide--

Column 16, Claim 11 Line 7: Please correct " suicide"
To read --silicide--

Column 16, Claim 17 Line 48: Please correct " ring"
To read -- film--

Signed and Sealed this

Fourth Day of September, 2007

JON W. DUDAS
*Director of the United States Patent and Trademark Office*